(12) United States Patent
Duqi et al.

(10) Patent No.: US 12,484,444 B2
(45) Date of Patent: Nov. 25, 2025

(54) INTEGRATED THERMAL SENSOR AND MANUFACTURING PROCESS THEREOF

(71) Applicant: STMICROELECTRONICS S.R.L., Agrate Brianza (IT)

(72) Inventors: Enri Duqi, Milan (IT); Maria Eloisa Castagna, Catania (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 130 days.

(21) Appl. No.: 17/931,482

(22) Filed: Sep. 12, 2022

(65) Prior Publication Data
US 2023/0087516 A1    Mar. 23, 2023

(30) Foreign Application Priority Data
Sep. 22, 2021  (IT) .......................... 102021000024386

(51) Int. Cl.
*H10N 10/855* (2023.01)
*H10N 10/01* (2023.01)
*H10N 10/17* (2023.01)

(52) U.S. Cl.
CPC .......... *H10N 10/855* (2023.02); *H10N 10/01* (2023.02); *H10N 10/17* (2023.02)

(58) Field of Classification Search
CPC . H10N 10/855; H10N 10/17; G01J 5/04–045; G01J 5/023; G01J 5/12
See application file for complete search history.

(56) References Cited

U.S. PATENT DOCUMENTS

| 2,645,675 A | * | 7/1953 | Arvin | ..................... H10N 10/17 136/224 |
| 2,984,696 A | * | 5/1961 | Shaffer | .................. H10N 10/00 136/223 |

(Continued)

FOREIGN PATENT DOCUMENTS

| CN | 101575083 A | 11/2009 |
| CN | 219319590 U | 7/2023 |

(Continued)

OTHER PUBLICATIONS

DE-102008002157-A1 English machine translation (Year: 2009).*
(Continued)

*Primary Examiner* — Andrew J Golden
(74) *Attorney, Agent, or Firm* — Seed Intellectual Property Law Group LLP

(57) ABSTRACT

Integrated thermal sensor having a housing delimiting an internal space. A support region extends through the internal space; a plurality of thermocouple elements are carried by the support region and are electrically coupled to each other. Each thermocouple element is formed by a first and a second thermoelectrically active region of a first and, respectively, a second thermoelectrically active material, the first thermoelectrically active material having a first Seeback coefficient, the second thermoelectrically active material having a second Seeback coefficient, other than the first Seeback coefficient. At least one of the first and second thermoelectrically active regions is a silicon-based material. The first and second thermoelectrically active regions of each thermocouple element are formed by respective elongated regions extending at a mutual distance into the internal space of the housing, from and transversely to the support region.

16 Claims, 13 Drawing Sheets

(56) References Cited

U.S. PATENT DOCUMENTS

| | | | | |
|---|---|---|---|---|
| 3,400,452 | A | * | 9/1968 | Emley .................... H10N 10/17 136/203 |
| 4,106,952 | A | * | 8/1978 | Kravitz .................. H02S 40/44 136/246 |
| 2009/0260667 | A1 | * | 10/2009 | Chen ...................... H10N 10/00 136/201 |
| 2010/0212711 | A1 | * | 8/2010 | Liu ........................ H10N 10/17 136/205 |
| 2012/0180839 | A1 | * | 7/2012 | Hedler ................... H10N 10/17 438/54 |
| 2013/0081662 | A1 | * | 4/2013 | Dibra ..................... H10N 10/17 438/54 |
| 2014/0246066 | A1 | | 9/2014 | Chen et al. |
| 2015/0048249 | A1 | * | 2/2015 | Hedler ................... H10N 10/17 250/338.4 |
| 2015/0102443 | A1 | * | 4/2015 | Herrmann ............... G01J 5/023 438/57 |
| 2015/0316418 | A1 | * | 11/2015 | Hedler ................... H10N 10/17 438/54 |
| 2018/0335347 | A1 | * | 11/2018 | Herrmann ............... G01J 5/045 |

FOREIGN PATENT DOCUMENTS

| | | | |
|---|---|---|---|
| DE | 10 2006 015 492 A1 | 10/2007 | |
| DE | 102006055263 A1 | 5/2008 | |
| DE | 102008002157 A1 * | 12/2009 | ................ G01J 5/02 |
| EP | 3913681 A2 | 11/2021 | |
| WO | WO-2007113133 A2 * | 10/2007 | ............. H01L 27/16 |
| WO | WO 2020242384 A1 | 12/2020 | |

OTHER PUBLICATIONS

WO-2007113133-A2 English machine translation (Year: 2007).*

Böttner et al., "Formation of Nanometerscale Layers of V-Vi ($Bi_{2Te3}$-related) Compounds Based on Amorphous Prestages," Fraunhofer IPM, Jan. 2007. (4 pages).

Böttner et al., "MicroPelt®: State of the Art Road Map and Applications," Fraunhofer IPM, 2004. (4 pages).

Böttner et al., "New high density micro structured thermogenerators for stand alone sensor systems," 2007 26th International Conference on Thermoelectrics, 2007. (4 pages).

Böttner et al., "New Thermoelectric Components Using Microsystem Technologies," *Journal of Microelectromechanical Systems* 13(3):414-420, Jun. 2004.

Parasuraman et al., "Deep reactive ion etching of sub-micrometer trenches with ultra high aspect ratio," *Microelectronic Engineering* 113: 35-39, 2014.

Yousef et al., "Vertical Thermopiles Embedded in a Polyimide-Based Flexible Printed Circuit Board," *Journal of Microelectromechanical Systems* 16(6):1341-1348, Dec. 2007.

* cited by examiner

INTEGRATED THERMAL SENSOR AND MANUFACTURING PROCESS THEREOF

BACKGROUND

Technical Field

The present disclosure pertains to the field of devices for converting thermal energy into electrical energy. Specifically, the present description refers to an integrated thermal sensor based on the Seebeck effect and to the manufacturing process thereof.

In particular, a thermal sensor formed by a plurality of thermocouples connected in series, also called a thermopile, is described below.

Description of the Related Art

As is known, thermopiles are devices capable of converting electromagnetic radiation, in the infrared region (in the band from 1.1 to 25 µm), into electrical signals that may be used in numerous applications.

For example, the use of thermopiles has already been proposed to provide dynamic imaging devices, smart lighting systems, smart buildings and in various fields.

Thermopiles are formed by multiple thermocouples generally connected in series or, less commonly, in parallel. Each thermocouple is formed by portions of dissimilar materials and generates a voltage when the junctions are exposed to different temperatures.

FIG. 1 schematically shows the operating principle of a thermocouple 1. The thermocouple 1 comprises a first portion 2 of a first material, coupled at its ends (first and second ends 3 and 4) to two second portions 5 of a different material.

The first and second portions 2, 5 are made of different materials, for example metals or compounds of materials of groups V-VI (such as alloys or compounds of Bi, Sb, Te, Se).

The ends 3 and 4 of the first portion 2 form junctions with the second portions 5; e.g., the first end 3 forms a sensing junction (sometimes also called hot junction) and the second end 4 forms a reference junction (sometimes also called cold junction).

Furthermore, the second portions 5 each have a free end 6; the free ends 6 form an output having a potential difference $\Delta V$ correlated to the temperature difference $\Delta T$ existing between the sensing junction 3 and the reference junction 4, according to the Seebeck equation:

$$\Delta V = (SB - SA)\Delta T = S\Delta T \quad (1)$$

wherein SA and SB are the Seebeck coefficients (or thermoelectric power) relating to the materials of the first ends 3 and, respectively, of the second ends 4.

Thus, the greater the temperature difference between sensing junction 3 and reference junction 4, the greater the voltage sensed at output 6.

A thermopile may be formed by series-connecting several thermocouples 1, as shown in FIG. 2, where the same reference numbers as in FIG. 1 have been used. In practice, the thermopile (indicated by 10) comprises a series of first portions 2 (of the first material) and of second portions 5 (of the second material), alternated to each other, connected at the sensing junctions 3 and at the reference junctions 4.

In this manner, the output voltage difference is given by the sum of the $\Delta V$s of all the thermocouples 1 and, in case the temperatures of the hot and cold junctions 3, 4 are approximately the same for all the thermocouples 1 (as in case of small integrated sensors), for n thermocouples 1 it is:

$$\Delta V = nS\Delta T \quad (2)$$

Integrated manufacturing of thermopiles has already been proposed, using semiconductor technology, so as to reduce the size of the device and allow the use thereof in portable devices, such as cell phones, tablets and the like.

These solutions generally provide for the manufacturing of horizontal thermocouples, formed in thin film of thermoelectric material on rigid silicon substrates or on flexible plastic substrates. However, these solutions are generally based on the use of non-standard materials and/or require complex processing steps and the thermopiles that may be obtained are affected by noise and have low sensitivity.

Thermopiles have also been proposed having a vertical structure by forming regions of thermoelectric material in a plastic substrate.

For example, a thermopile having vertical structure is described in "Vertical Thermopiles Embedded in a Polyimide-Based Flexible Printed Circuit Board" by Hanna Yousef et al., Journal of Micromechanical Systems, vol. 16, No. 6, December 2007, and is shown in FIG. 3. Here, a body 12 (for example of plastics, such as polyimide) accommodates a plurality of thermocouples 13, each comprising a first sensitive region 15 and a second sensitive region 16, arranged side by side and at a mutual distance.

The first and second sensitive regions 15, 16 may be of different metal material, for example by multiple antimony and nickel wires, formed in through holes in the body 12 and connected in parallel.

Interconnections 18 connect the first and second sensitive regions 15, 16 of each thermocouple 13 to each other and connect the different thermocouples 13 in series, forming hot and cold junctions.

However, this solution is also susceptible of improvement as regards conversion efficiency and requires a rather complex manufacturing process.

In general, in these and other known solutions, to overcome the rather-low-efficiency problem, and in order to achieve efficiency up to a few hundred of V/W, non-standard materials are used in the semiconductor industry and/or process steps are complex and require complex and expensive machinery and measures.

BRIEF SUMMARY

The aim of the present disclosure is to provide a thermopile which overcomes the drawbacks of the prior art.

According to the present disclosure, an integrated thermal sensor and the manufacturing method thereof are provided.

The present disclosure is directed to an integrated thermal sensor comprising: a housing delimiting an internal space, a support region, extending through the internal space, an absorbing layer on an opposite side of the internal space from the support region, and a plurality of thermocouple elements, between the support region and the absorbing layer, the plurality of thermocouple elements being electrically coupled to each other, each thermocouple element including a first and a second thermoelectrically active region of a first and, respectively, a second thermoelectrically active material, the first thermoelectrically active material having a first Seeback coefficient, the second thermoelectrically active material having a second Seeback coefficient, different from the first Seeback coefficient, at least one of the first and second thermoelectrically active regions is a silicon-based material, the first thermoelectrically active region having a base in contact with the absorbing layer, the second thermoelectrically active region being spaced from the absorbing layer by the base of the first thermoelectrically active region, the first and second thermoelectrically active regions of each thermocouple element including respective elongated regions extending at a mutual distance into the internal space of the housing, from and transversely to the support region.

BRIEF DESCRIPTION OF THE SEVERAL VIEWS OF THE DRAWINGS

For a better understanding of the present disclosure, some embodiments thereof are now described, purely by way of non-limiting example, with reference to the drawings, wherein.

DETAILED DESCRIPTION

The following description refers to the arrangement shown; consequently, expressions such as "above," "below," "top," "bottom," "right," "left," "lateral," etc., relate to the figures and are not to be intended in an absolute or limiting manner.

Furthermore, as to the manufacturing process, this is carried out at the wafer level, unless otherwise indicated, whereby the structures shown in FIGS. 6A-6M are generally replicated several times in each wafer and separated at the end or in an intermediate step through a dicing step, in an obvious manner for the person skilled in the art.

Furthermore, the number of thermocouples in each thermopile may be any, depending on technological, efficiency and robustness considerations, and also the matrix-like arrangement shown may vary according to the design specifications, in an obvious manner for the person skilled in the art.

Figure 1:
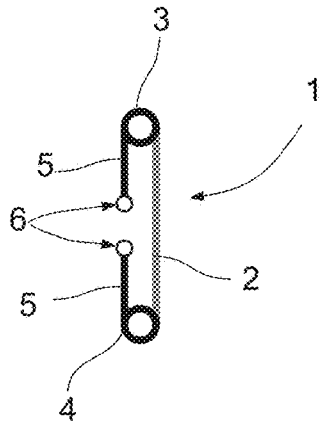
FIG. 1 is a schematic representation of a thermocouple usable as a temperature sensor.
Figure 2:
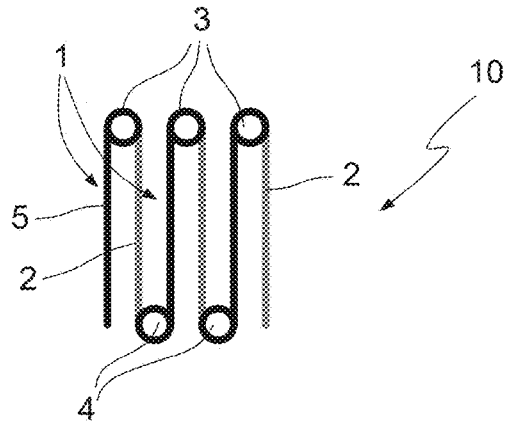
FIG. 2 shows the series connection of a plurality of thermocouples of FIG. 1 to form a thermopile.
Figure 3:
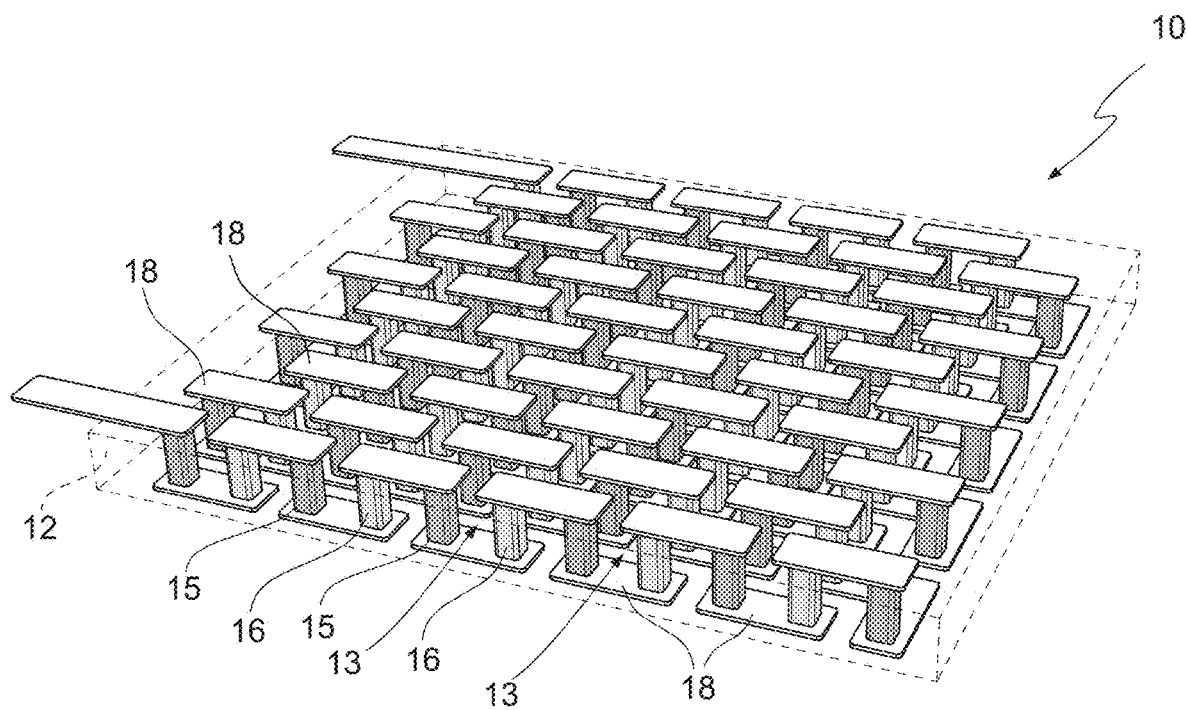
FIG. 3 is a perspective view, with parts in ghost, of an implementation of the thermopile of FIG. 2.
Figure 4:
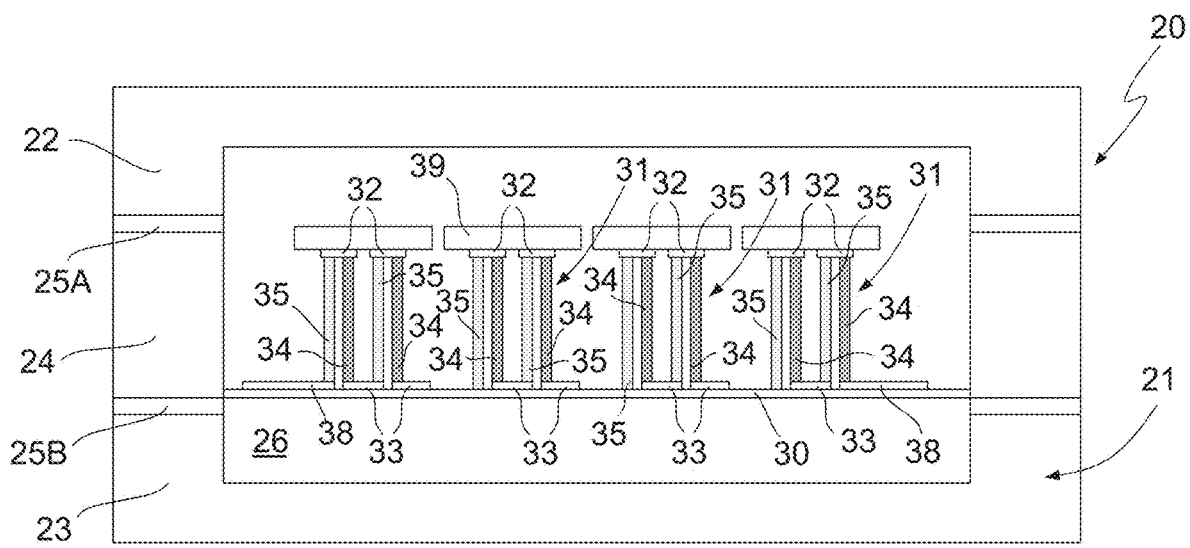
FIG. 4 is a cross-sectional view of the schematic structure of the present thermopile.
Figure 5:
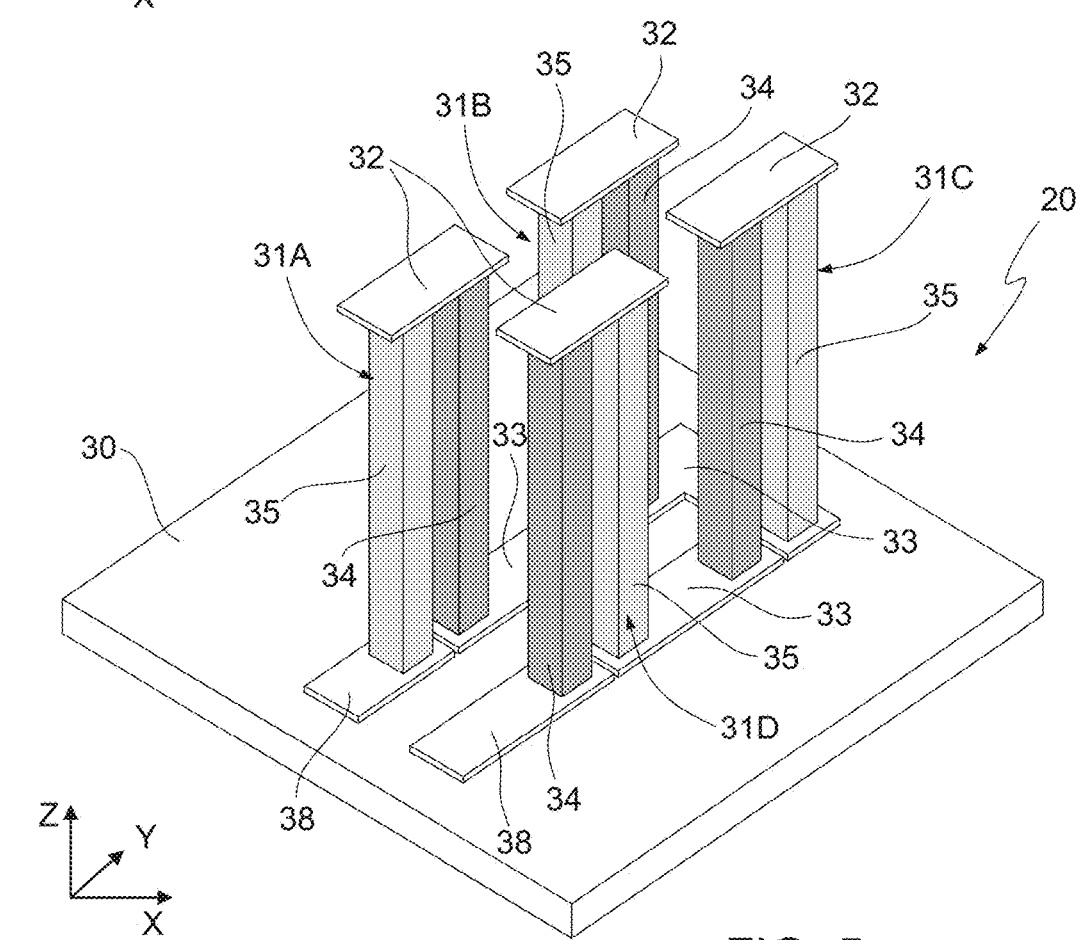
FIG. 5 is a schematic perspective view of the thermopile of FIG. 4.

FIGS. 4 and 5 show an integrated thermal sensor, hereinafter referred to as a thermopile 20.

The thermopile 20 comprises a housing 21, here formed by a top cap 22, a bottom cap 23 and a peripheral wall 24. The top cap 22, the bottom cap 23 and the peripheral wall 24 may all be of silicon, e.g., by removing material in monocrystalline silicon wafers.

The peripheral wall 24 has a closed shape (in a top view, parallel to an XY plane of a Cartesian coordinate system XYZ), for example it extends along the sides of a square or a rectangle.

The top cap 22 and the bottom cap 23 have, in top view, a perimeter coincident with that of the peripheral wall 24 and are bonded thereabove and, respectively, therebelow, for example through respective glass frit layers 25A, 25B, so as to define a hollow internal space 26.

As an alternative to what is shown, the top cap 22 might be made more recessed and be bonded directly to the bottom cap 23, without arranging the peripheral wall 24 therebetween.

A carrying layer 30 extends through the hollow internal space 26, between the sides of the peripheral wall 24, here aligned with the glass frit layer 25B.

The carrying layer 30 has a main extension parallel to the XY plane and may be of insulating material, for example of silicon oxide, or be formed by a multilayer, including an insulating layer.

The carrying layer 30 supports a plurality of thermocouples 31, for example arranged side by side to each other, with a matrix-like arrangement (see also FIG. 5) and here coupled in series through top and bottom connection regions 32, 33 formed on opposite ends of the thermocouples 31, as discussed below.

Each thermocouple 31 comprises a first thermoelectrically active region or first leg 34, and a second thermoelectrically active region or second leg 35, of material having a different Seebeck coefficient with respect to the first leg 34.

At least one of the first and second legs 34, 35 is of semiconductor material, such as silicon, silicon-germanium.

If both the first and second legs 34, 35 of the thermocouples 31 are of semiconductor material, in particular silicon, they are of opposite conductivity types; for example, the first legs 34 may be P-type, and the second legs 35 may be N-type.

Alternatively, the first legs 34 may be a metal such as aluminum Al, nickel Ni, silicon-chromium Si—Cr and the second legs 35 may be N-type semiconductor material.

The first and second legs 34, 35 have an elongated shape and extend perpendicular to the XY plane (along a thickness direction Z of the Cartesian coordinate system XYZ), parallel to each other.

In detail, the first and second legs 34, 35 of each thermocouple 31 are mutually spaced, so as to be electrically connected at the ends only.

In particular, the bottom end of a first leg 34 of a thermocouple 31 is coupled to the bottom end of a second leg 35 of a thermocouple 31 that is adjacent thereto (or in any case subsequent in the series path) through a bottom connection region 33; the top ends of the first and second legs 34, 35 of a same thermocouple 31 are mutually coupled through a top connection region 32.

End connection regions 38 electrically couple the plurality of thermocouples 31 to other electrical structures, inside or outside the housing 21, for example through pads not shown.

The thermopile 20 may comprise a plurality of thermocouples 31 arranged to form a matrix of N×M elements, as shown in FIG. 5.

In FIG. 5, four thermocouples 31A-31D are shown, arranged in a 2×2 configuration, for purely illustrative reasons.

In this configuration, therefore, the first leg 34 of the first thermocouple 31A is coupled to the second leg 35 of the second thermocouple 31B; the first leg 34 of the second thermocouple 31B is coupled to the second leg 35 of the third thermocouple 31C; the first leg 34 of the third thermocouple 31C is coupled to the second leg 35 of the fourth thermocouple 31D; the second leg 35 of the first thermocouple 31A and the first leg 34 of the fourth thermocouple 31D are coupled to the outside by a respective one of the end connection regions 38.

The bottom connection regions 33 and the end connection regions 38 are here formed above the carrying layer 30; alternatively, they may be embedded in the latter.

An absorption layer 39 may extend above the top connection regions 32; the absorption layer 39, for example an ARC (Anti Reflective Coating) filter may be formed as a single layer, extending above all the thermocouples 31 or (as shown in FIG. 4) be formed by a plurality of separate portions. The absorption layer 39 may be missing.

The bottom cap 23 of the thermopile 20 may be bonded to a support (not shown) carrying electrical connections and possibly a processing element, for example an ASIC ("Application Specific Integrated Circuit"), for processing the signals provided by the thermopile 20.

As a result, the top connection regions 32 receive the light, and in particular the infrared radiation, through the top cap 22, which is transparent, and are hot junctions (hereinafter identified with the same reference number 32) and the bottom connection regions 33 are shielded by the support, and therefore are cold junctions (hereinafter identified with the same reference number 33), operating as a reference for the hot junctions.

In practice, the thermocouples 31 are sorts of "pillars" extending inside the hollow internal space 26 and having hot junctions 32 facing the top cap 22.

In this manner, the thermocouples 31 are surrounded by air (possibly at a lower pressure than atmospheric pressure) both laterally, above and below (except the carrying layer 30, which may be of a minimum thickness to have a desired robustness).

Furthermore, the housing 21 thermally insulates the same thermocouples 31 from other external thermal influences.

The hermetic closure provided by the housing 21 thus allows heat dispersions by conduction to be avoided and consequently a high sensitivity to be obtained.

The possible absorption layer 39, if made as a single layer or formed by portions in contact with multiple thermocouples 31, allows the hot junctions 32 to be thermally joined.

The thermopile 20 may be manufactured as described in detail hereinafter with reference to FIGS. 6A-6L and 7A-7D.

Figure 6A:
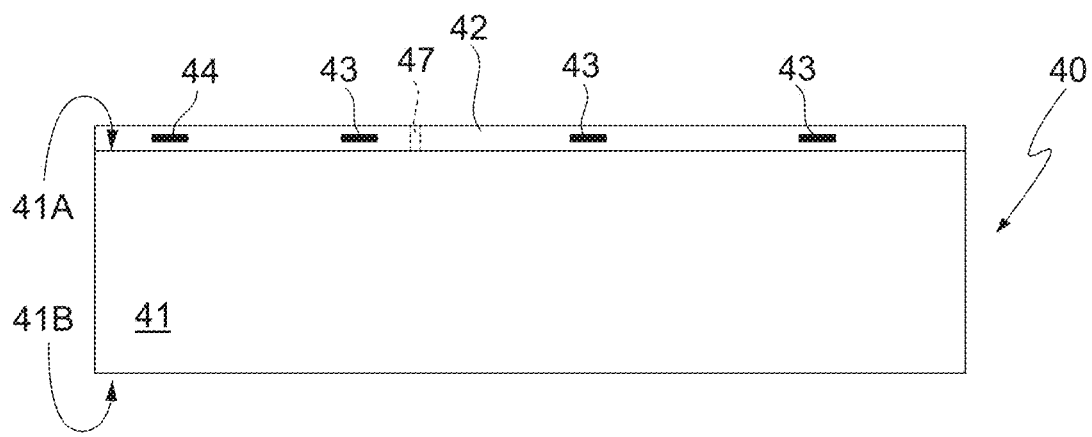
FIGS. 6A-6M are cross-sections through a semiconductor structure in subsequent manufacturing steps of an embodiment of the thermopile of FIGS. 4 and 5.

With reference to FIG. 6A, an initial wafer 40 comprises a body 41 having a first surface 41A and a second surface 41B. An insulating layer 42, for example of oxide, extends on the first surface 41A and accommodates first contact regions 43 and electrical connection lines 44, e.g., of polycrystalline silicon.

For example, the insulating layer 42 is formed by depositing a first silicon oxide layer; depositing and patterning a polysilicon layer to form the first contact regions 43 and the electrical connection lines 44 and depositing a second silicon oxide layer. The first contact regions 43 and electrical connection lines 44 may be arranged as shown in FIG. 6A.

The insulating layer 42 may also be etched to form through holes (only one shown dashed and indicated by 47), for the reasons explained hereinbelow.

The insulating layer 42 is intended to form the carrying layer 30 of FIG. 4, and may have an overall thickness comprised between 0.2 μm and 10 μm.

Figure 6B:
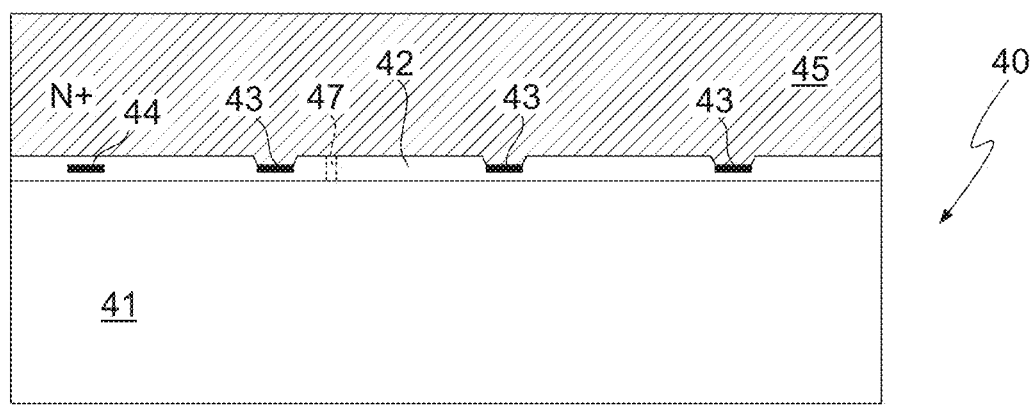

Then, FIG. 6B, first contacts are opened, by selectively removing the insulating layer 42 above the first contact regions 43 and forming openings extending thereto.

A structural layer 45, for example of silicon of a first conductivity type, for example N+, is then epitaxially grown, possibly after having deposited a seed layer, in the example, of silicon. The structural layer 45 may have a thickness comprised between 40 and 200 μm.

The structural layer 45 then extends into the previously formed openings, forming contact portions 46, in direct contact with the first contact regions 43. Furthermore, the structural layer also grows into the holes 47.

Figure 6C:
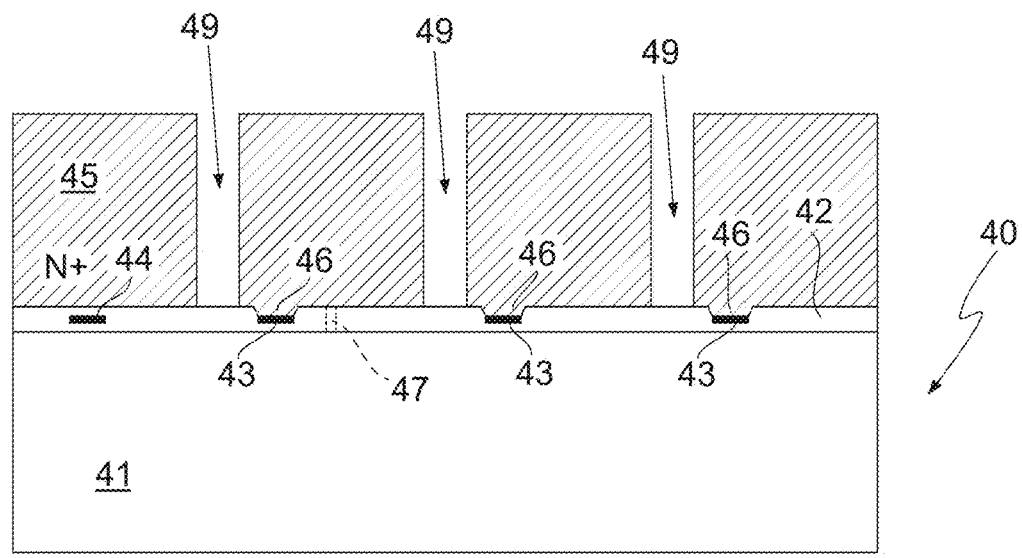

In FIG. 6C, first definition trenches 49 are formed in the structural layer 45, by an etching which automatically stops on the insulating layer 42. The first definition trenches 49 therefore extend throughout the thickness of the structural layer 45, up to the insulating layer 42. Here, each first definition trench 49 extends laterally offset with respect to a respective contact portion 46 and to the corresponding first contact region 43.

Figure 7A:
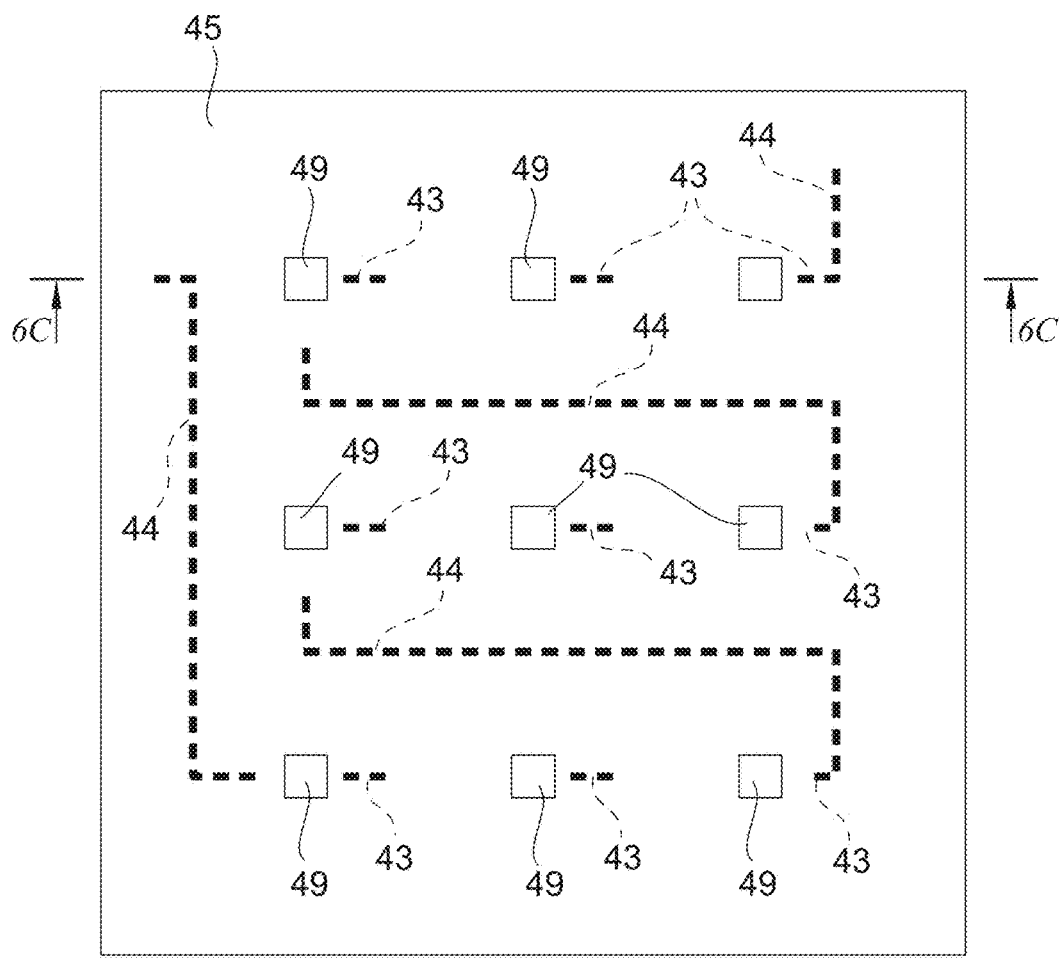
FIGS. 7A-7D are top views of the intermediate structures of FIGS. 6C, 6E, 6G and 6K, taken along respective cross-section lines 6C-6C, 6E-6E, 6G-6G and 6K-6K.

The first definition trenches 49 may have a polygonal section (as shown, for example, in FIG. 7A, having the first contact regions 43 and the electrical connection lines 44 also shown therein, even if they are not actually visible from above). Alternatively, the first definition trenches 49 may have a round or oval or any section.

Figure 6D:
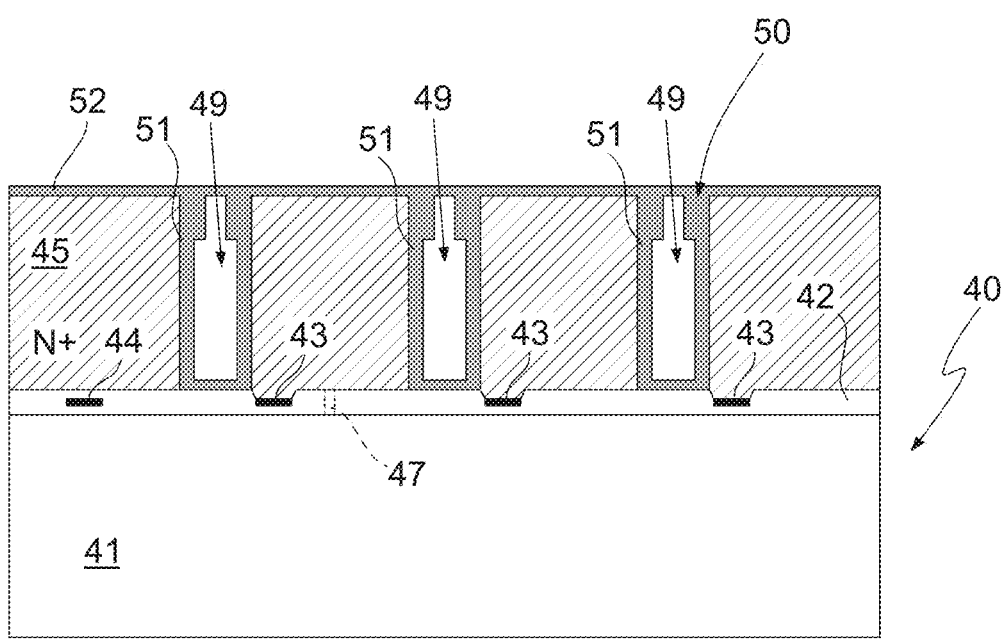

Then, FIG. 6D, an insulation layer 50, for example oxide, is deposited. The insulation layer 50 lays on the bottom and on the walls of the first definition trenches 49 (where it forms an insulation shell 51) and closes them upwardly through a superficial layer 52, which also extends on the surface of the structural layer 45. The superficial layer 52 is an insulator such as silicon dioxide.

The superficial layer 52 is then thinned, e.g., by CMP (Chemical Mechanical Polishing).

Figure 6E:
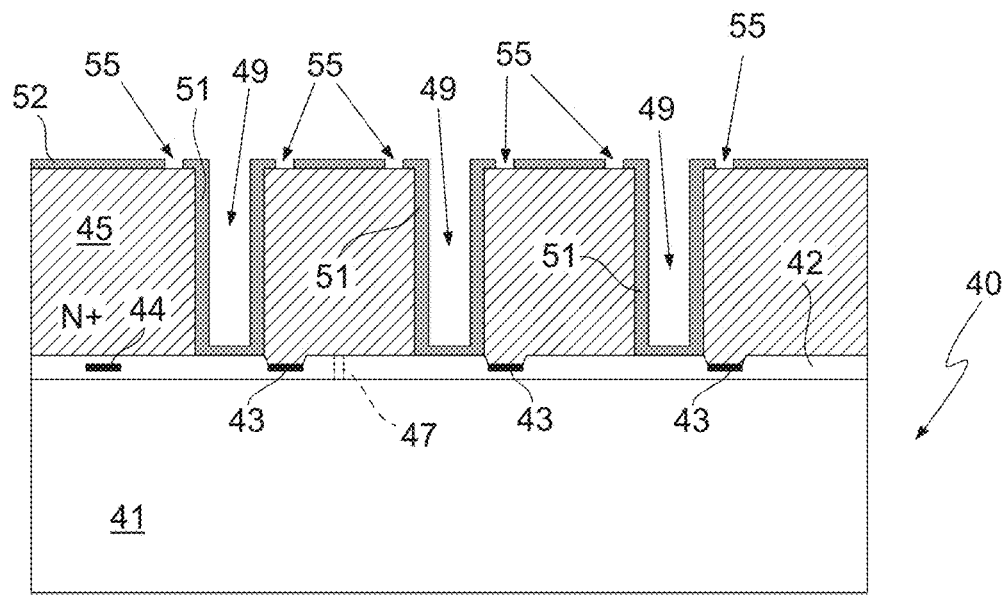
Figure 7B:
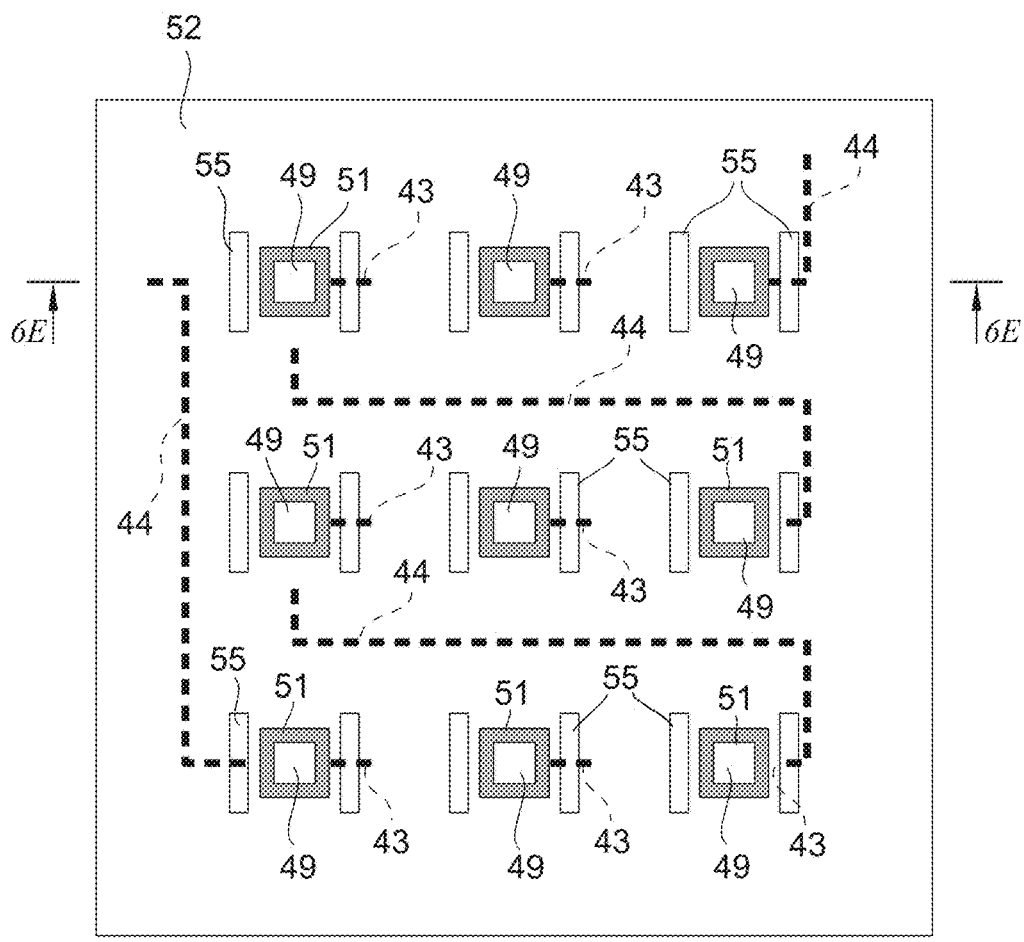

In FIG. 6E, the superficial layer 52 is selectively removed both at the entrance of the first definition trenches 49 and where second contact regions are to be formed, using usual photolithographic steps.

Then, the first definition trenches 49 are reopened upwardly (while maintaining the internal coating formed by the respective insulation shell 51) and, on the surface of the structural layer 45, openings 55 are formed which expose the underlying structural layer. In particular, the openings 55 are arranged laterally to the first definition trenches 49, as visible in FIG. 7B.

Figure 6F:
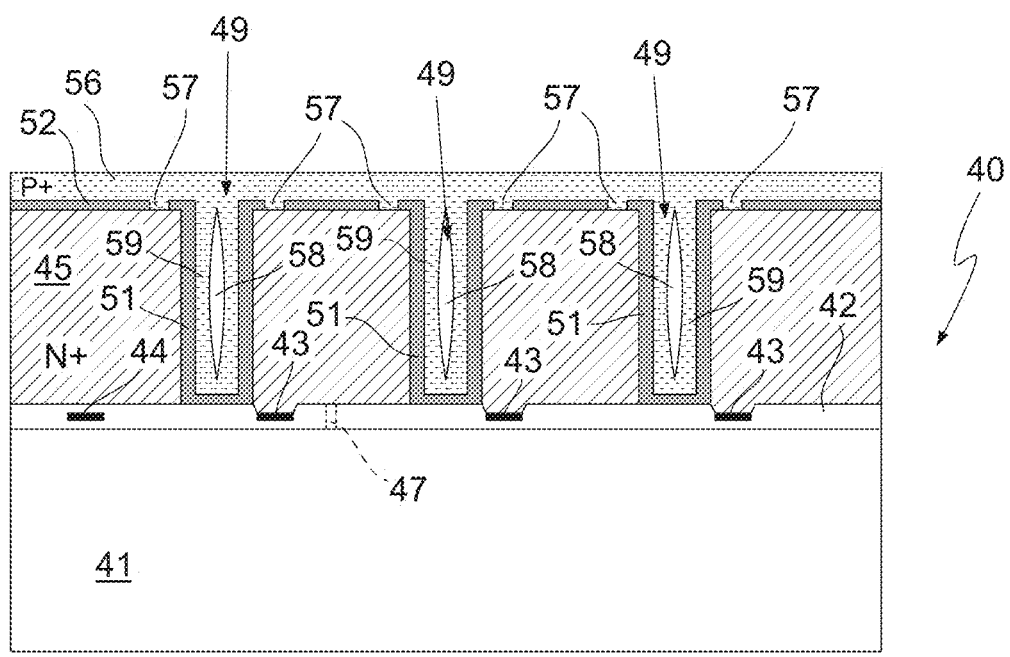

Then, FIG. 6F, a thermoelectrically active material layer 56, for example silicon of a second conductivity type (in the example considered, of P-type) is deposited. The thermoelectrically active material layer 56 fills the first definition trenches 49, where it forms first thermoelectric regions 59, forming for example the first legs 34 of FIG. 4.

The thermoelectrically active material layer 56 also covers the surface of the initial wafer 40, also filling openings 55, and forming herein second contact regions 57.

The thermoelectrically active material layer 56 may not completely fill the first definition trenches 49, as shown in FIG. 6F; in this case the first thermoelectric regions 59 may have empty zones 58 (not represented in the subsequent figures).

Figure 6G:
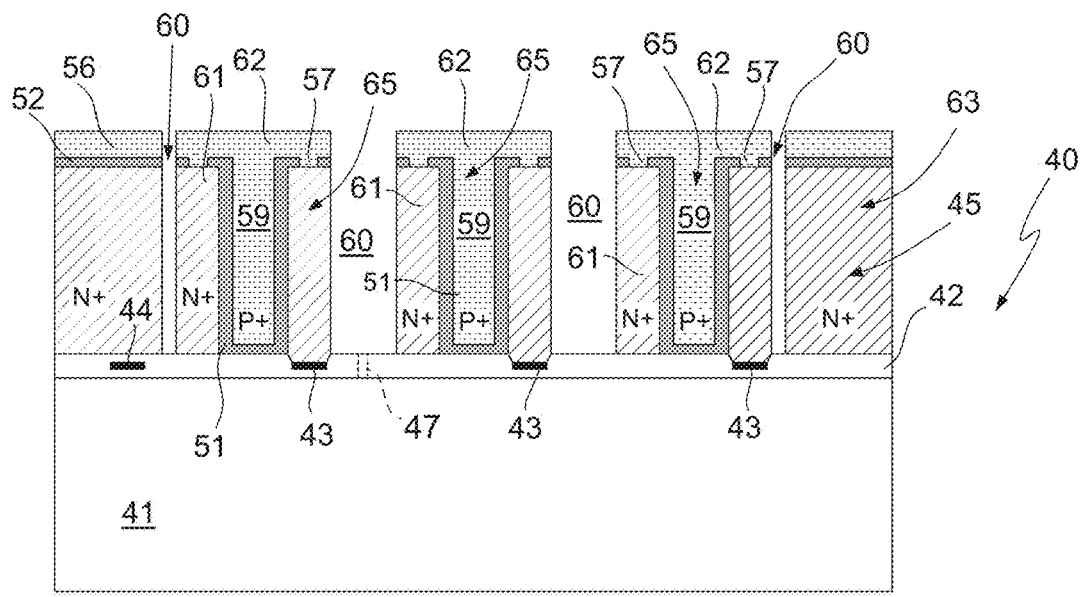

In FIG. 6G a second definition trench 60 is formed by masked etching of the thermoelectrically active material layer 56, of the superficial layer 52 and of the structural layer 45; the etch stops automatically on the insulating layer 42.

Figure 7C:
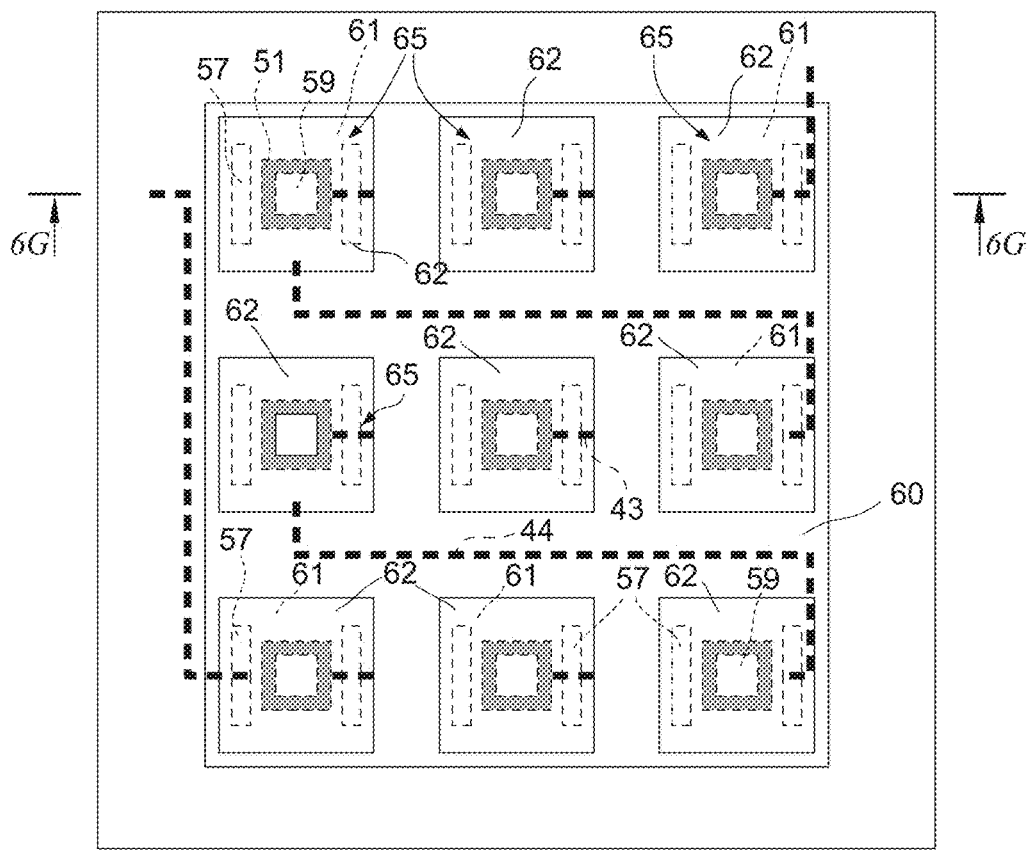

The second definition trench 60 has for example the shape shown in FIG. 7C and delimits a plurality of pillars 65, here having a quadrangular base (or any useful shape).

In the embodiment shown, therefore, in each pillar 65, the remaining portion of the structural layer 45 forms a second thermoelectric region 61, of annular shape, surrounding a respective insulation shell 51 (in turn surrounding a respective first thermoelectric region 59).

Furthermore, in each pillar 65, the remaining portion of the thermoelectrically active material layer 56 surrounded by the second definition trench 60 forms a connection base 62. The connection bases 62 are monolithic with the respective first thermoelectric regions 59 and in direct electrical contact with the respective second thermoelectric regions 61 through the second contact regions 57.

The remaining portions of the structural layer 45, of the superficial layer 52 and of the thermoelectrically active material layer 56, outside the second definition trench 60, instead form a frame 63, similar to the peripheral wall 24 of FIG. 4.

In practice, therefore, in the embodiment shown, in each pillar 65, the insulation shell 51 electrically insulates the facing lateral surfaces of the first and second thermoelectric regions 59, 61 from each other and these are series-coupled at one end (top end, in FIG. 6G) through the respective connection base 62 and the respective second contact regions 57 (see also FIG. 7C).

Each pillar 65 thus forms a thermocouple 31 of FIG. 4 and each second thermoelectric region 61 forms, e.g., a second leg 35 of FIG. 4.

Furthermore, if the holes 47 have been formed at the second definition trench 60, the etching to form the second definition trench 60 leads to the removal of the epitaxial silicon deposited in the holes 47.

Figure 6H:
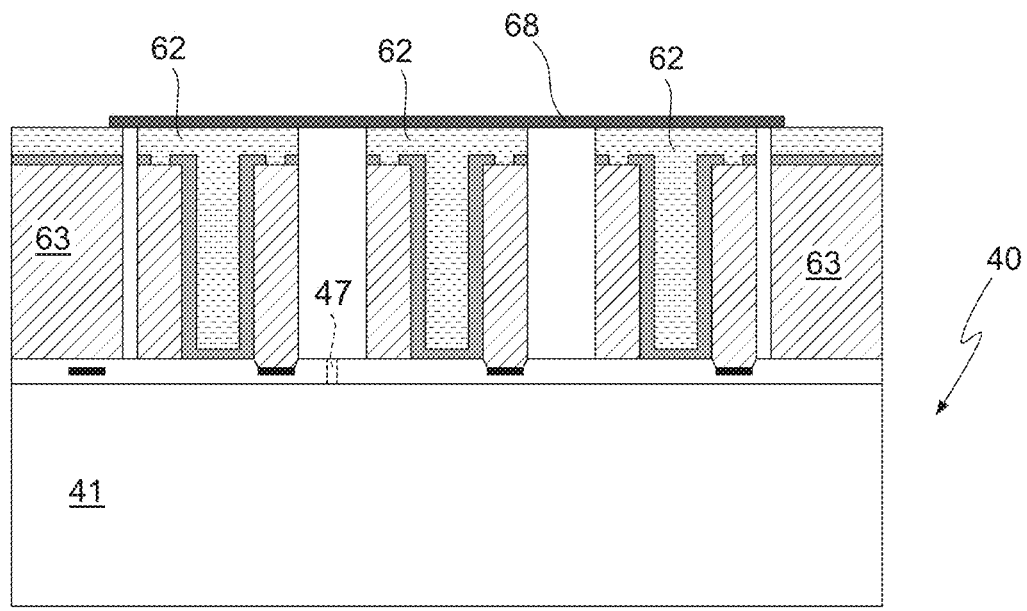

In FIG. 6H, an absorbing layer 68 is formed above the connection bases 62. The absorbing layer 68 is configured to preferentially absorb electromagnetic radiation in a desired band, here in the infrared, and acts to increase the radiation area and to maximize the absorption of electromagnetic radiation.

For example, the absorbing layer 68 may be a dry resist layer deposited and defined to cover the zone of the pillars 65, slightly superimposing to the frame 63.

As an alternative to what is shown, the absorbing layer 68 may be spread with a stencil on the connection bases 62 only.

Figure 8:
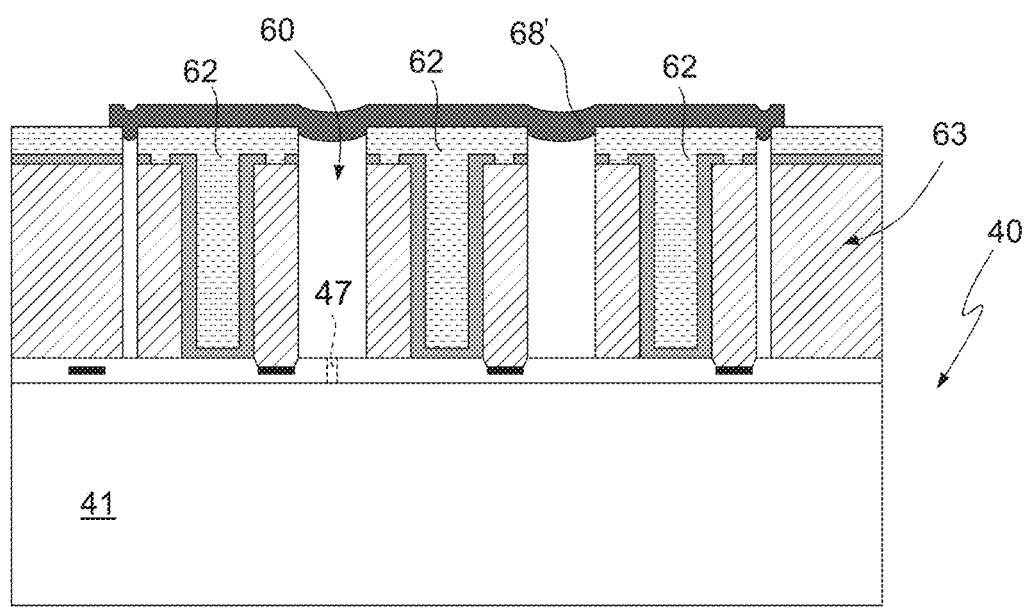
FIG. 8 is a cross-section of a different embodiment of the intermediate structure in the step of FIG. 6H.

FIG. 8 shows a variant of the process step of FIG. 6H. Here, the absorbing layer, indicated by 68', is formed by a polymeric layer or other flexible layer, applied for example through a stencil. Given the flexibility of the absorbing layer 68', it may bend at the second definition trench 60 and partially penetrate therein.

Figure 6I:
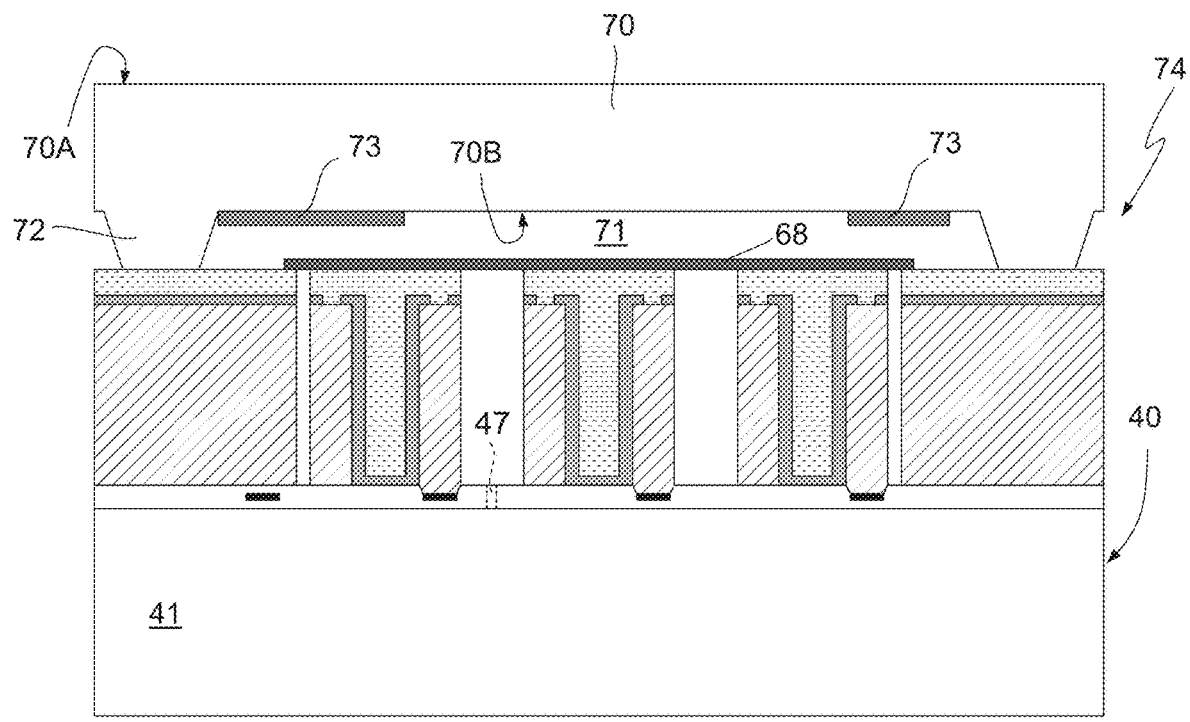

In FIG. 6I, a first cap 70 is attached to the initial wafer 40. The first cap 70 has an external face 70A and an internal face 70B; the internal face 70B faces the initial wafer 40 and has a recess 71.

The recess 71 has here an area (in the XY plane) that is greater than the area of the second definition trench 60.

The first cap 70 may be attached at the wafer level and therefore may be formed by a wafer of semiconductor material, such as silicon, processed to form the cavity 71.

Within the cavity 71, getter regions 73 may be formed.

The first cap 70 therefore has a protruding edge 72 attached to the frame 63, on the thermoelectrically active material layer 56, using any bonding process, for example silicon on silicon or through an adhesive layer, such as an oxide or glass frit, or also through a metal layer of Al—Ge or Au—Sn (not shown).

The initial wafer 40 and the first cap 70 thus form together an intermediate wafer 74.

Figure 6J:
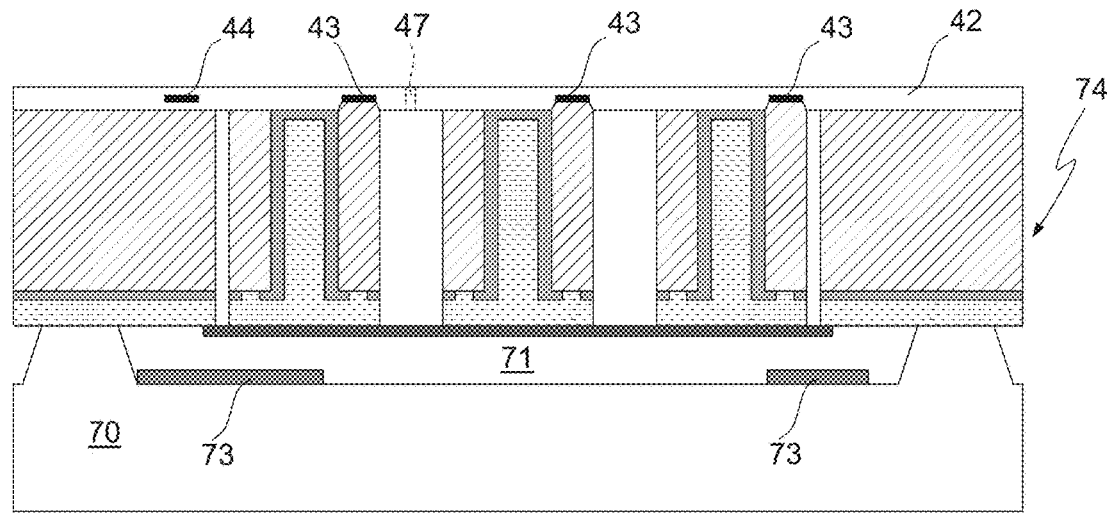

Subsequently, FIG. 6J, the intermediate wafer 74 is flipped over and the body 41 is removed, for example by grinding or by partial grinding, followed by a silicon etching which stops on the insulating layer 42.

In this step, the holes 47 in the insulating layer 42 are completely opened on the bottom, putting the recess 71 in communication with the outside.

Figure 6K:
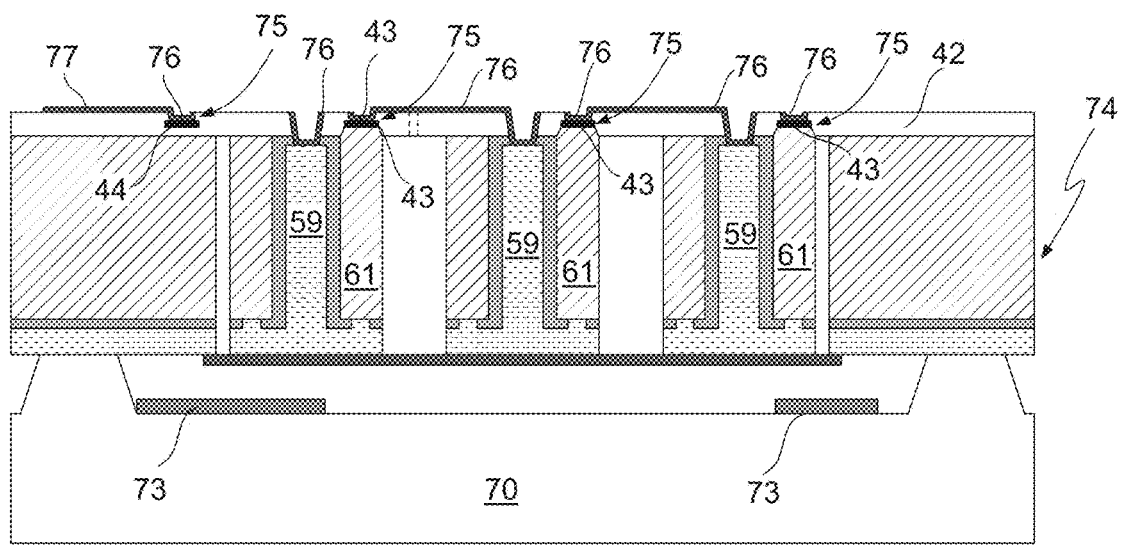
Figure 7D:
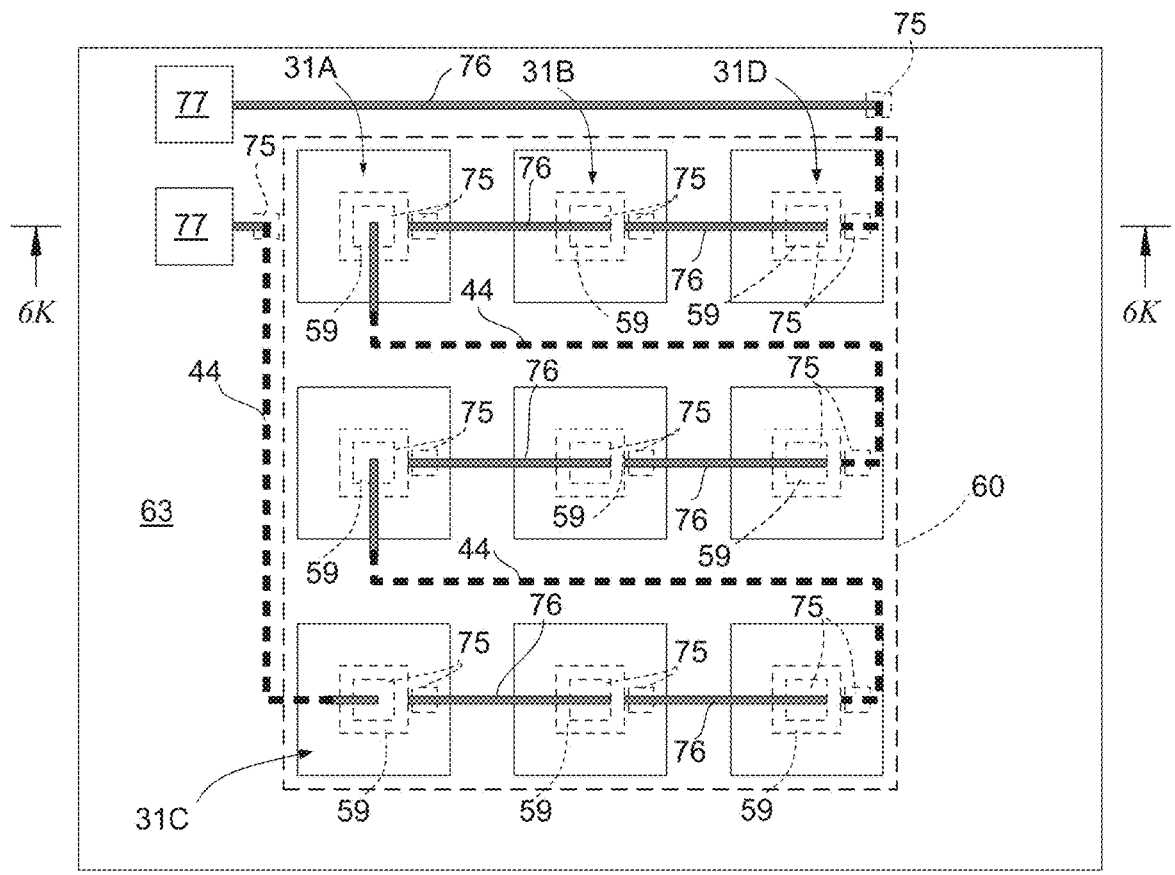

In FIGS. 6K and 7D, metal contact lines 76 are formed.

To this end, the insulating layer 42 is etched at the first contact regions 43, at the first thermoelectric regions 59 and at the ends of the electrical connection lines 44, forming openings 75; a metal layer, e.g., of aluminum, is deposited and defined, forming the metal contact lines 76 (see also FIG. 7D, wherein the dashed line indicates the periphery of the second definition trench 60).

The ends of the metal contact lines 76 extend into the openings 75 and are in direct electrical contact with first contact regions 43 (not visible in FIG. 7D), with the first thermoelectric regions 59 and with the ends of the electrical connection lines 44.

The metal layer also forms pads 77 on the frame 63.

In this manner, as visible in particular in FIG. 7D, the metal contact lines 76 couple a second thermoelectric region 61 of a thermocouple 31 (e.g., the thermocouple identified with 31A in FIG. 7D) with the first thermoelectric region 59 of a subsequent thermocouple (e.g., the thermocouple identified with 31B in FIG. 7D), providing the series connection of the thermocouples 31. Furthermore, the metal contact lines 76 couple the first and last thermocouples 31 of the series (thermocouples 31C and 31D in FIG. 7D) to the pads 77.

Figure 6L:
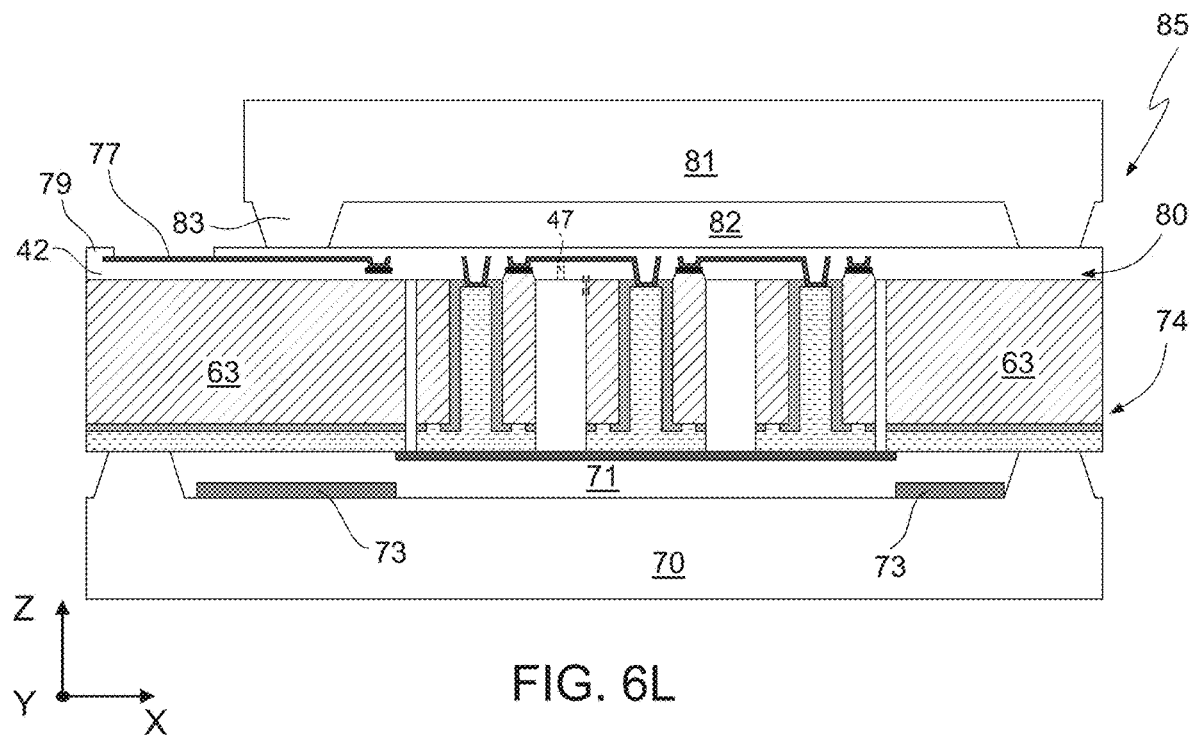

In FIG. 6L, a passivation layer 79 is deposited above the insulating layer 42 and the metal contact lines 76 and is opened at the pads 77. The passivation layer 79 forms, with the insulating layer 42, a carrying layer 80, similar to the carrying layer 30 of FIG. 4.

A second cap 81 may then be bonded to the intermediate wafer 74. The second cap 81 may also be formed by a wafer suitably processed to form a cavity overlying the pads 77 and subsequently lapped to expose the pads 77; after bonding, a final wafer 85 is thus obtained.

In both cases, the second cap 81 has a recess 82 facing the intermediate wafer 74 and having an area (in the XY plane) that is greater than the second definition trench 60, but here smaller than the area of the cavity 71.

The recess 82 is delimited by a protruding edge 83 which is bonded to the passivation layer 79, at the frame 63.

The bonding of the second cap 81 and the intermediate wafer 74 may occur in a low-pressure environment, to reduce the amount of air present in the recess 82.

In this manner, the recess 82, fluidically connected to the cavity 71 through the second definition trench 60 and holes 47 in the insulating layer 42, is hermetically closed to the outside after bonding the second cap 81.

After bonding, the getter regions 73 may be activated.

Figure 6M:
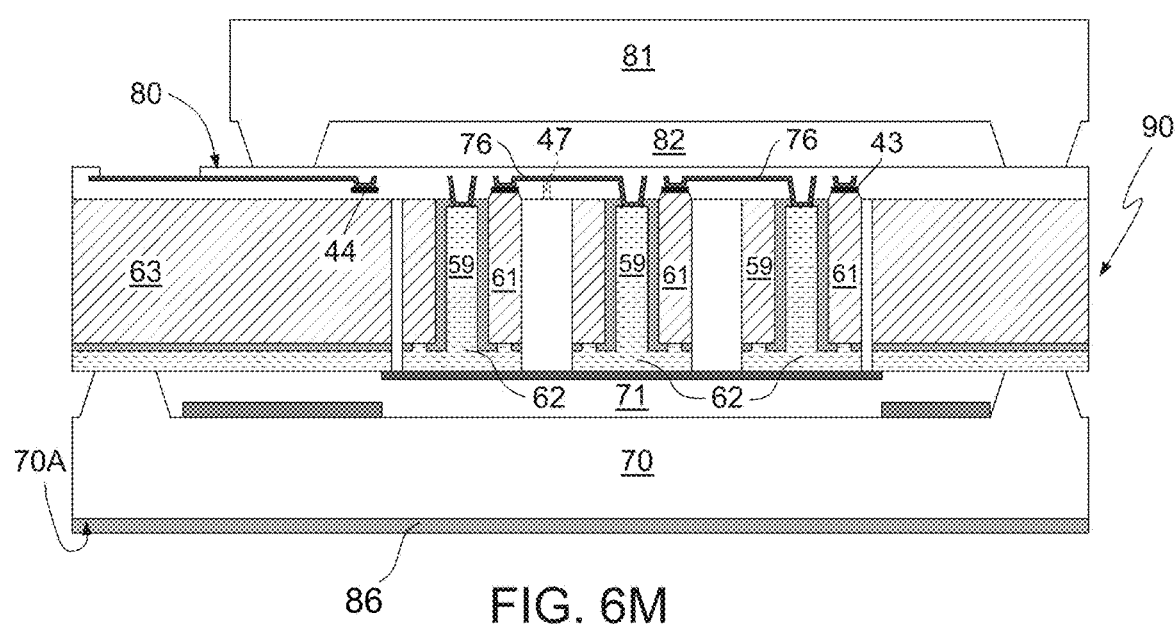

In FIG. 6M, an anti-reflective (ARC—Anti Reflective Coating) layer 86 is formed on the external surface 70A of the first cap 70. The stack that forms the anti-reflective layer 86 may form optical filters, if it is desired to select the wavelengths as a function of the chosen application.

This may be useful, for example, in thermometry applications, in particular to distinguish the contribution due to the temperature of a certain object with respect to the external environment, in case the object emits in a certain band. For example, the human body emits thermal radiation at a wavelength of about 10 μm (typically 8-12 μm). In this case, any optical filters, together with the anti-reflective layer 86, may only pass waves with a wavelength proximate to the desired spectrum range.

Optical filters suitable for the purpose are for example interferential ones, formed by a stack of multiple dielectric layers (usually two) with different refractive indexes from each other. As the number of layers increases, filters with a very flat passband around the wavelength of interest and at the same time with a well-defined window may be provided.

Subsequently, the final wafer 85 may be singulated, to form a thermopile 90.

In both cases, the connection bases 62, which couple the first thermoelectric region 59 and the second thermoelectric region 61 of each thermocouple 31 form hot junctions (similar to the hot junctions 32 of FIG. 4), and the metal contact lines 76, which couple the first thermoelectric region 59 and the second thermoelectric region 61 of two different thermocouples 31, form cold junctions (similar to the cold junctions 33 of FIG. 4).

Figure 9:
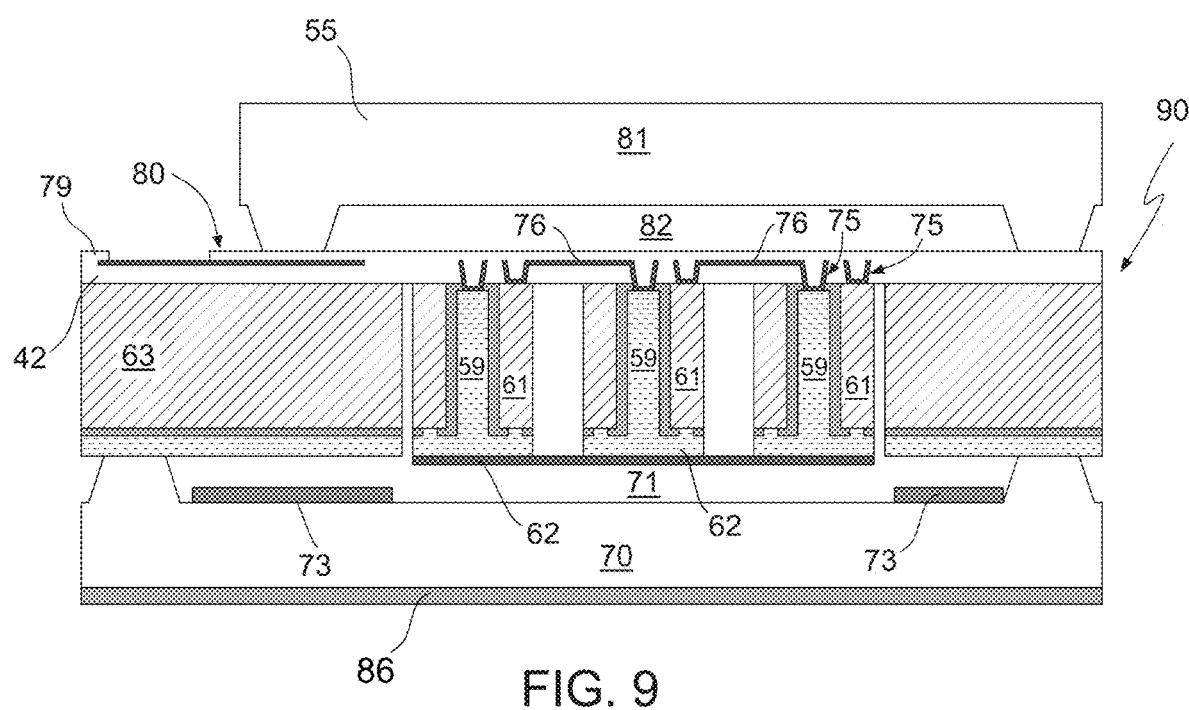
FIG. 9 is a cross-section of a different embodiment of the present thermopile.

FIG. 9 shows a variant of the thermopile 90, which does not use contact regions 43 and electrical connection lines 44 of polysilicon.

In this case, the insulating layer 42 may be formed by a single layer; the steps of depositing and shaping a polysilicon layer to form the first contact regions 43 and the electrical connection lines 44 and of opening the first contacts are missing and the contact portions 46 described with reference to FIGS. 6A and 6B are not formed. Furthermore, in the step of FIG. 6K, all the openings 75 reach up to the structural layer 45 and the metal contact lines 76 are directly in contact with the structural layer 45 also at the second thermoelectric regions 61.

The thermopile and the manufacturing process described herein have numerous advantages.

In fact, owing to the possibility of using standard materials and process steps in the semiconductor industry, the thermopile has small dimensions and low manufacturing costs.

Consequently, it may be used in several applications, even when cost and/or dimensions are important.

Furthermore, owing to the pillar shape of the thermocouples 31, which are surrounded by air both laterally and at the ends (above/below), the present thermopile has great sensitivity, low noise and high efficiency.

In the case of use as an infrared sensor, the present thermopile allows for low cross-talking and optimum pixel Noise Equivalent Thermal Difference (NETD).

Finally, it is clear that modifications and variations may be made to the integrated thermal sensor and the manufacturing process described and illustrated herein without thereby departing from the scope of the present disclosure, as defined in the claims.

For example, as indicated, the first legs 34 may be a metal such as aluminum and the second legs 35 may be an N-type silicon-based semiconductor material, such as silicon-germanium.

The pads 77 may be made on the opposite face of the frame 63, for example using silicon through vias.

The first cap 70 might be bonded directly to the superficial layer 52 or to the structural layer 45.

A blackening layer might be provided within the recess 82 or on the external surface of the second cap 81.

Although the arrangement shown in FIGS. 6A-6M (wherein the second thermoelectric regions 61 annularly surround the first thermoelectric regions 59) is optimal for thermal conversion, the first and second thermoelectric regions 59, 61 of each thermocouple 31 might be arranged simply adjacent to each other, and separated by an insulation wall similar to the insulation layer 50; in particular, the second definition trench 60 might completely remove the silicon of the structural layer 45 from one side of the first thermoelectric regions 59, so that the second thermoelectric regions 61 do not completely surround the first thermoelectric regions 59.

According to another embodiment, no material might extend between the first and second thermoelectric regions 59, 61 of each thermocouple 31, and these regions might simply be insulated by the air present in the housing formed by the caps 70, 81 and the frame 63.

An integrated thermal sensor, may be summarized as including a housing (21) delimiting an internal space (26); a support region (30; 80), extending through the internal space; and a plurality of thermocouple elements (31), carried by the support region (30; 80) and electrically coupled to each other, each thermocouple element (31) including a first and a second thermoelectrically active region (34, 35; 59, 61) of a first and, respectively, a second thermoelectrically active material, the first thermoelectrically active material having a first Seeback coefficient, the second thermoelectrically active material having a second Seeback coefficient, other than the first Seeback coefficient, wherein at least one of the first and second thermoelectrically active regions (34, 35; 59, 61) is a silicon-based material, the first and second thermoelectrically active regions (34, 35; 59, 61) of each thermocouple element (31) being formed by respective elongated regions extending at a mutual distance into the internal space (26) of the housing (21), from and transversely to the support region (30; 80).

The second thermoelectrically active region (35; 61) of each thermocouple element (31) may be of silicon, for example epitaxial silicon, of a first conductivity type and the first thermoelectrically active region (34; 59) of each thermocouple element (31) may be of material chosen from polycrystalline silicon of a second conductivity type, polycrystalline silicon-germanium of the second conductivity type and metal.

Each thermocouple element (31) may be the shape of a pillar (65) having a first and a second end and including an electrically insulating wall (51) extending between the first and second thermoelectrically active regions (59, 61) of the respective thermocouple element (31), wherein each thermocouple element (31) may be bonded to the support region (30; 80) at the first end.

The electrically insulating wall (51) of each thermocouple element (31) may have a generally cylindrical shape annularly surrounding the respective first thermoelectrically active region (59) and the second thermoelectrically active region (61) may have a generally cylindrical shape annularly surrounding the respective electrically insulating wall (51).

The support region (30; 80) may include an insulating material layer; first connection lines (33, 38; 43, 44) extend on or in the support region (30; 80) and electrically couple the first thermoelectrically active region (34; 59) of a first thermocouple element (31) of the plurality of thermocouple elements with a second thermoelectrically active region (35; 61) of a second thermocouple element of the plurality of thermocouple elements.

Each thermocouple element (31) may include a connection region (32; 62) of semiconductor material electrically coupling the first and second thermoelectrically active regions (34, 35; 59, 61) of each thermocouple element (31) at the second end.

The connection region (32; 62) of the thermocouple elements (31) may be monolithic with the first thermoelectrically active region.

The housing (21) may include a first and a second cap (70, 81) of semiconductor material bonded to the support region (30; 80).

The integrated thermal sensor may include a structural layer (45) having a first and a second face, wherein a trench (60) may extend through the structural layer (45) and separates, in the structural layer, the plurality of second thermoelectrically active regions (61) and a frame (63) surrounding the plurality of second thermoelectrically active regions; the first cap (70) may be bonded to the frame (63) on the first face of the structural layer and the second cap (81) may be bonded to the frame (63) on the second face of the structural layer (45); the support region (80) may extend on the second face of the structural layer; the first and second electrical connection regions (59; 61) may be formed on the first and on the second faces of the structural layer (45) and electrically couple the first and second thermoelectrically active regions of the thermocouple elements.

A process for manufacturing an integrated thermal sensor, may be summarized as including forming a support region (30; 80); forming a plurality of thermocouple elements (31) on the support region, the thermocouple elements being electrically coupled to each other and including each a first and a second thermoelectrically active region (34, 35; 59, 61) of a first and, respectively, a second thermoelectrically active material, the first thermoelectrically active material having a first Seeback coefficient, the second thermoelectrically active material having a second Seeback coefficient, other than the first Seeback coefficient, wherein at least one of the first and second thermoelectrically active regions is of silicon-based material and the first and second thermoelectrically active regions are formed by respective elongated regions carried, at a mutual distance, from and transversely to the support region; and forming a housing (21) delimiting an internal space (26) traversed by the support region (30; 80) and accommodating the plurality of thermocouple elements (31).

The process may include forming a carrying layer (42); forming a structural layer (45) on the carrying layer, the structural layer being of the second thermoelectrically active material and having a first and a second surface; forming a plurality of first trenches (49) traversing the structural layer (45); forming a plurality of electrically insulating regions (51) in the first trenches (49); introducing the first thermoelectrically active material into the first trenches (49) and forming the first thermoelectric regions (61); defining the structural layer (45) to form the plurality of second thermoelectric regions (61) and a frame region surrounding the second thermoelectric regions (61); forming first electrical connection regions (62) electrically coupling the first and second thermoelectric regions of each thermocouple element; forming second electrical connection regions (75) electrically coupling a first thermoelectric region of a thermocouple element and a second thermoelectric region of a different thermocouple element; and bonding a first cap (70) to a first face of the frame (63); and bonding a second cap (81) to a second face of the frame region.

Forming a carrying layer (80) may include forming an insulating material layer (42) and forming a structural layer (45) may include epitaxially growing the structural layer.

Introducing the first thermoelectrically active material may include depositing a layer of the first thermoelectrically active material inside the first trenches (49) and on the first surface of the structural layer to form a surface conductive layer (56) and forming first electrical connection regions (62) may include defining the surface conductive layer (56).

Forming second electrical connection regions (75) may include depositing and patterning a metal layer on the second surface of the structural layer (45).

The second thermoelectrically active region of each thermocouple element may be of silicon, for example epitaxial silicon, of a first conductivity type and the first thermoelectrically active region of each thermocouple element may be of a material chosen from polycrystalline silicon of a second conductivity type, polycrystalline silicon-germanium of the second conductivity type, and metal.

Forming a carrying layer (42) may include forming the carrying layer (42) on a semiconductor body (41) and the semiconductor material body may be removed prior to forming the second electrical connection regions (75).

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An integrated thermal sensor, comprising:
   a housing delimiting an internal space, the housing including a first cap and a second cap;
   a structural layer having a first face, a second face opposite to the first face, and a frame, the first cap on the frame and the first face of the structural layer, the second cap on the frame and the second face of the structural layer;
   a support layer on the second face of the structural layer and extending through the internal space;
   a first plurality of connection regions on the support layer and the second face of the structural layer;
   an absorbing layer on the first face of the structural layer and extending through the internal space;
   a second plurality of connection regions on the first face of the structural layer, the absorbing layer being on the second plurality of connection regions; and
   a plurality of thermocouple of elements surrounded by the frame and between the support layer and the absorbing layer, the plurality of thermocouple elements being electrically coupled to each other, each thermocouple element including:
   a first leg including a first thermoelectrically active region; and
   a second leg spaced from the first leg, the second leg including a second thermoelectrically active region,
   the first thermoelectrically active region and the second thermoelectrically active region being a first thermoelectrically active material and a second thermoelectrically active material, respectively, the first thermoelectrically active material having a first Seebeck coefficient, the second thermoelectrically active material having a second Seebeck coefficient, different from the first Seebeck coefficient,
   the first leg being on a first connection region of the first plurality of connection regions, the second leg being on a second connection region of the first plurality of connection regions, a third connection region of the second plurality of connection regions being on the first leg and the second leg,
   the first leg and the second leg being electrically coupled to each other by the third connection region, the second leg being electrically coupled to the first leg of another thermocouple element by the second connection region, the first and second legs of each of the plurality of thermocouple elements including respective elongated regions extending at a mutual distance into the internal space of the housing, from and transversely to the support layer; and trenches extending through the structural layer, the trenches separating, in the structural layer, the second thermoelectrically active regions of the plurality of thermocouple elements and the frame;

the absorbing layer including a first portion on the third connection region of a first thermocouple element of the plurality of thermocouple elements and on the third connection region of a second thermocouple element of the plurality of thermocouple elements, and a second portion on the third connection region of a third thermocouple element of the plurality of thermocouple elements and on the third connection region of a fourth thermocouple element of the plurality of thermocouple elements, the first portion and the second portion of the absorbing layer being spaced from each other.

2. The integrated thermal sensor according to claim 1, wherein the second thermoelectrically active region of each thermocouple element includes silicon of a first conductivity type and the first thermoelectrically active region of each thermocouple element is of material chosen from polycrystalline silicon of a second conductivity type, polycrystalline silicon-germanium of the second conductivity type and metal.

3. The integrated thermal sensor according to claim 1, wherein each thermocouple element is the shape of a pillar having a first and a second end and including an electrically insulating wall extending between the first and second thermoelectrically active regions of the respective thermocouple element, wherein each thermocouple element is bonded to the support layer at the first end.

4. The integrated thermal sensor according to claim 3, wherein the electrically insulating wall of each thermocouple element has a generally cylindrical shape annularly surrounding the respective first thermoelectrically active region and the second thermoelectrically active region has a generally cylindrical shape annularly surrounding the respective electrically insulating wall.

5. The integrated thermal sensor according to claim 3, wherein the support layer includes an insulating material layer.

6. The integrated thermal sensor according to claim 1, wherein, for each thermocouple element, the third connection region is monolithic with the first thermoelectrically active region of the first leg.

7. The integrated thermal sensor according to claim 1, wherein at least one of the first and second thermoelectrically active regions is a silicon-based semiconductor material.

8. The integrated thermal sensor according to claim 1, wherein the second thermoelectrically active region encircles the first thermoelectrically active region.

9. A device, comprising:
a housing including a first cap and a second cap;
a structural layer having a first surface, a second surface opposite to the first surface, and a frame, the first cap on the frame and the first surface of the structural layer, the second cap on the frame and the second surface of the structural layer;
a carrying layer in the housing and on the second surface of the structural layer;
a plurality of connection regions;
a plurality of thermocouples on the carrying layer, surrounded by the frame, and electrically coupled to each other, each of the plurality of thermocouples including:
a first leg having a first thermoelectrically active region including a first thermoelectrically active material having a first Seebeck coefficient; and
a second leg having a second thermoelectrically active region including a second thermoelectrically active material having a second Seebeck coefficient,
the first leg being on a first connection region of the plurality of connection regions, the second leg being on a second connection region of the plurality of connection regions, a third connection region of the plurality of connection regions being on the first leg and the second leg,
the first leg and the second leg being electrically coupled to each other by the third connection region,
the second leg being electrically coupled to the first leg of another thermocouple by the second connection region;
trenches extending through the structural layer, the trenches separating, in the structural layer, the second thermoelectrically active regions of the plurality of thermocouples and the frame, and
an absorbing layer on the plurality of thermocouples,
the third connection regions of the plurality of thermocouples extending between the first and second legs and the absorbing layer,
the absorbing layer including a first portion on the third connection region of a first thermocouple of the plurality of thermocouples and on the third connection region of a second thermocouple of the plurality of thermocouples, and a second portion on the third connection region of a third thermocouple of the plurality of thermocouples and on the third connection region of a fourth thermocouple of the plurality of thermocouples,
the first portion and the second portion of the absorbing layer being spaced from each other.

10. The device of claim 9, wherein at least one of the first and second thermoelectrically active regions is a silicon-based material.

11. The device of claim 9, wherein the first thermoelectrically active region has a first conductivity type, and the second thermoelectrically active region has a second conductivity type.

12. The device of claim 9, wherein each of the plurality of thermocouples includes an insulating layer, the first thermoelectrically active region being spaced from the second thermoelectrically active region by the insulating layer.

13. A device, comprising:
a housing including a first cap and a second cap;
a substrate in the housing, the substrate having a first face, a second face opposite to the first face, and a frame the first cap on the first face the second cap on the second face;
a plurality of connection regions on the substrate and in the housing;
a plurality of thermocouples on the substrate, surrounded by the frame, and in the housing, each of the plurality of thermocouples including:
a first leg including a first thermoelectrically active region having a first Seebeck coefficient; and a second leg including a second thermoelectrically active region having a second Seebeck coefficient that is different than the first Seebeck coefficient, the first leg being on a first connection region of the plurality of connection regions, the second leg being on a second connection region of the plurality of connection regions, a third connection region of the plurality of connection regions being on the first leg and the second leg, the first leg and the second leg being electrically coupled to each other by the third connection region, the second leg being electrically coupled to the first leg of another thermocouple by the second connection region; and trenches extending through the substrate, the trenches separating the second thermoelectrically active regions of the plurality of thermocouples and the frame;

an absorption layer on the first face of the substrate and in the housing, the absorption layer being on the third connection regions of the plurality of thermocouples, the absorption layer including a first portion on the third connection region of a first thermocouple of the plurality of thermocouples and on the third connection region of a second thermocouple of the plurality of thermocouples, and a second portion on the third connection region of a third thermocouple of the plurality of thermocouples and on the third connection region of a fourth thermocouple of the plurality of thermocouples, the first portion and the second portion of the absorption layer being spaced from each other.

14. The device according to claim 13, wherein the first thermoelectrically active regions of the plurality of thermocouples include metal and the second thermoelectrically active regions of the plurality of thermocouples include silicon-based semiconductor material.

15. The device of claim 13, wherein the first thermoelectrically active region has a first conductivity type, and the second thermoelectrically active region has a second conductivity type.

16. The device of claim 13, wherein each of the plurality of thermocouples includes an insulating layer, the first thermoelectrically active region being spaced from the second thermoelectrically active region by the insulating layer.

* * * * *